United States Patent
Li et al.

(10) Patent No.: US 11,310,920 B2
(45) Date of Patent: Apr. 19, 2022

(54) CIRCUIT BOARD, METHOD FOR MANUFACTURING THE SAME, AND BACKLIGHT

(71) Applicants: Hong Heng Sheng Electronical Technology (HuaiAn)Co., Ltd., Huaian (CN); Avary Holding (Shenzhen) Co., Limited., Shenzhen (CN)

(72) Inventors: Zu-Ai Li, Shenzhen (CN); Si-Hong He, Shenzhen (CN); Mei-Hua Huang, Shenzhen (CN); Ning Hou, Shenzhen (CN)

(73) Assignees: Hong Heng Sheng Electronical Technology (HuaiAn) Co., Ltd., Huaian (CN); Avary Holding (Shenzhen) Co., Limited., Shenzhen (CN)

( * ) Notice: Subject to any disclaimer, the term of this patent is extended or adjusted under 35 U.S.C. 154(b) by 179 days.

(21) Appl. No.: 16/959,137

(22) PCT Filed: May 30, 2019

(86) PCT No.: PCT/CN2019/089368
§ 371 (c)(1),
(2) Date: Jun. 29, 2020

(87) PCT Pub. No.: WO2020/237593
PCT Pub. Date: Dec. 3, 2020

(65) Prior Publication Data
US 2021/0410294 A1 Dec. 30, 2021

(51) Int. Cl.
*H05K 3/34* (2006.01)
*H05K 3/06* (2006.01)
(Continued)

(52) U.S. Cl.
CPC ............ *H05K 3/3452* (2013.01); *B23K 1/20* (2013.01); *H05K 1/0274* (2013.01); *H05K 1/056* (2013.01);
(Continued)

(58) Field of Classification Search
CPC .... H05K 3/3452; H05K 1/0274; H05K 1/056; H05K 3/06; H05K 2201/0358; H05K 1/02; H05K 3/00; B23K 1/20; B23K 2101/36
See application file for complete search history.

(56) References Cited

U.S. PATENT DOCUMENTS 10,609,815 B2 * 3/2020 Yang .................... B32B 27/36

FOREIGN PATENT DOCUMENTS

| CN | 106413269 A | * | 2/2017 | ........... H05K 3/0023 |
| TW | 201722231 A | * | 6/2017 | ........... H05K 1/0298 |

\* cited by examiner

*Primary Examiner* — Tracie Y Green
(74) *Attorney, Agent, or Firm* — ScienBiziP, P.C.

(57) ABSTRACT

A circuit board (100) includes an insulating base layer (11), a first conductive circuit layer (40) disposed on the base layer (11); a solder mask layer (60) covering the first conductive circuit layer (40) away from the base layer (11), wherein the solder mask layer (60) defines a slot (601), the slot (601) exposes a portion of the first conductive circuit layer (40), the solder mask layer (60) includes a sidewall (602) at the slot (601); and a cover film (70) covering the solder mask layer (60), wherein the cover film (70) defines an opening (701), the opening (701) corresponds to the slot (601) and exposes the solder pad (7401), the cover film (70) includes a covering portion (74) and a side reflecting portion (75), the covering portion (74) is disposed on the solder mask layer (60), the side reflecting portion (75) is connected to the covering portion (74) and covers the sidewall (602).

17 Claims, 14 Drawing Sheets

(51) Int. Cl.
*H05K 1/05* (2006.01)
*H05K 1/02* (2006.01)
*B23K 1/20* (2006.01)
B23K 101/36 (2006.01)

(52) U.S. Cl.
CPC ............ *H05K 3/06* (2013.01); *B23K 2101/36* (2018.08); *H05K 2201/0358* (2013.01)

CIRCUIT BOARD, METHOD FOR MANUFACTURING THE SAME, AND BACKLIGHT

FIELD

The subject matter herein generally relates to a circuit board, a method for manufacturing the circuit board, and a backlight.

BACKGROUND

A sub-millimeter-size light emitting diode (Mini LED) is an LED with a grain size of about tens of micrometers. As a new LED display technology, the Mini LEDs can be applied to LED display screens with small-pitch of P1.0 mm or less. When used in backlights, the Mini LEDs are transferred to rigid or flexible substrates in batches by COB or "four-in-one" technology, thereby achieving local dimming and generating finer HDR division. A brightness of the product can be increased when the Mini LED is combined with a substrate having a high light reflectivity.

Ink is usually printed on the entire surface of the product, and a thickness of the ink is also increased to allow the substrate to have high light reflectivity. However, high light reflectivity cannot be achieved at the side of the backlight.

SUMMARY

To overcome the above shortcoming, a backlight having a high light reflectivity is needed.

A circuit board applied in backlighting and a method for manufacturing the same are also needed.

The present disclosure provides a method of manufacturing a circuit board. A circuit substrate is provided, the circuit substrate includes an insulating base layer and a first conductive circuit layer disposed on a surface of the base layer.

A solder mask layer is disposed on a surface of the first conductive circuit layer away from the base layer. The solder mask layer is etched to form a slot, the slot exposes a portion of the first conductive circuit layer, the exposed portion of the first conductive circuit layer forms a solder pad, and the solder mask layer includes a sidewall at the slot.

A cover film is disposed on a surface of the solder mask layer having the slot away from the first conductive circuit layer, the cover film includes a first light diffusing material.

An opening is defined in the cover film, the opening corresponds to the slot and exposes the solder pad, the cover film includes a covering portion and an extending portion, the covering portion is disposed on the solder mask layer having the slot, the extending portion is connected to the covering portion, protrudes from the sidewall, and also surrounds the opening. The extending portion is pressed to the sidewall to form a side reflecting portion.

The present disclosure further provides a circuit board, including an insulating base layer.

A first conductive circuit layer is disposed on a surface of the base layer.

A solder mask layer covers a surface of the first conductive circuit layer away from the base layer. Wherein the solder mask layer defines a slot, the slot is configured to expose a portion of the first conductive circuit layer, the exposed portion of the first conductive circuit layer forms a solder pad, and the solder mask layer includes a sidewall at the slot.

A cover film covers a surface of the solder mask layer away from the first conductive circuit layer. Wherein the cover film includes a first light diffusing material, the cover film defines an opening, the opening corresponds to the slot and exposes the solder pad, the cover film includes a covering portion and a side reflecting portion, the covering portion is disposed on the solder mask layer having the slot, and the side reflecting portion is connected to the covering portion and covers the sidewall.

The present disclosure further provides a backlight, including a light emitting element. Wherein the backlight further includes the above-described circuit board. The light emitting element is electrically connected to the solder pad.

In the present disclosure, the side reflecting portion is disposed on the sidewall of the solder mask layer. When the light emitting element is connected to the solder pad, the side reflecting portion increases the light reflectivity at the side.

DESCRIPTION OF MAIN ELEMENTS

Copper substrate 10, base layer 11, copper foil 12, through hole 20, conductive hole 21, copper-plated layer 30, first conductive circuit layer 40, second conductive circuit layer 41, circuit substrate 42, first cover film 50, first adhesive layer 51, first insulating layer 52, solder mask layer 60, second cover film 70, second adhesive layer 71, second insulating layer 72, extending portion 73, covering portion 74, side reflecting portion 75, solder pad 401, circuit board 100, light emitting element 101, backlight 200, slot 601, sidewall 602, and opening 701.

Implementations of the disclosure are described with reference to the drawings.

DETAILED DESCRIPTION

Referring to FIGS. 1 to 13, the present disclosure provides an embodiment of a method for manufacturing a circuit board 100. The sequence of steps in the following method may be changed, and some steps may be omitted or combined with each other according to needs. The method includes the following steps.

Figure 1:
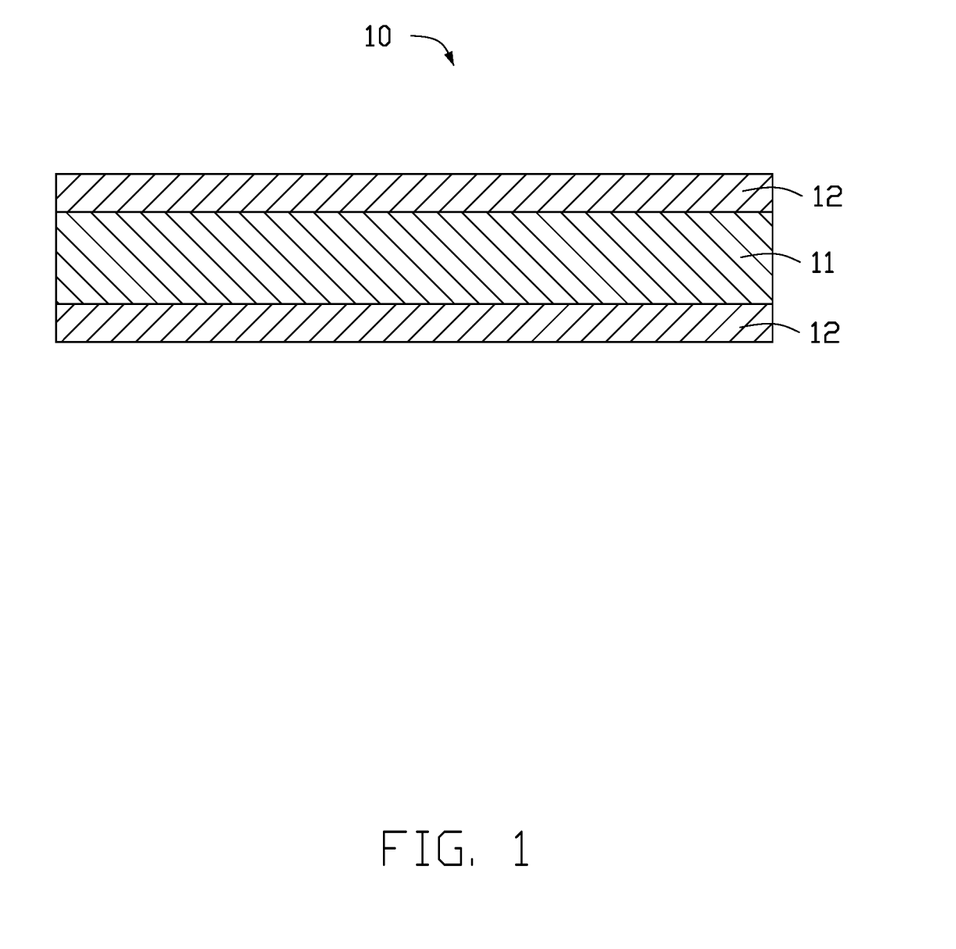
FIG. 1 is a cross-sectional view of a copper substrate in one embodiment according to the present disclosure.

Step 1, referring to FIG. 1, a copper substrate 10 is provided. The copper substrate 10 may be a flexible substrate, which includes an insulating base layer 11 and copper foils 12 disposed on two opposite surfaces of the base layer 11.

The base layer 11 may be made of an insulating material such as resin or glass. For example, the base layer 11 may be made of at least one resin of polyimide (PI), polyethylene terephthalate (PET), and polyethylene naphthalate (PEN).

Figure 2:
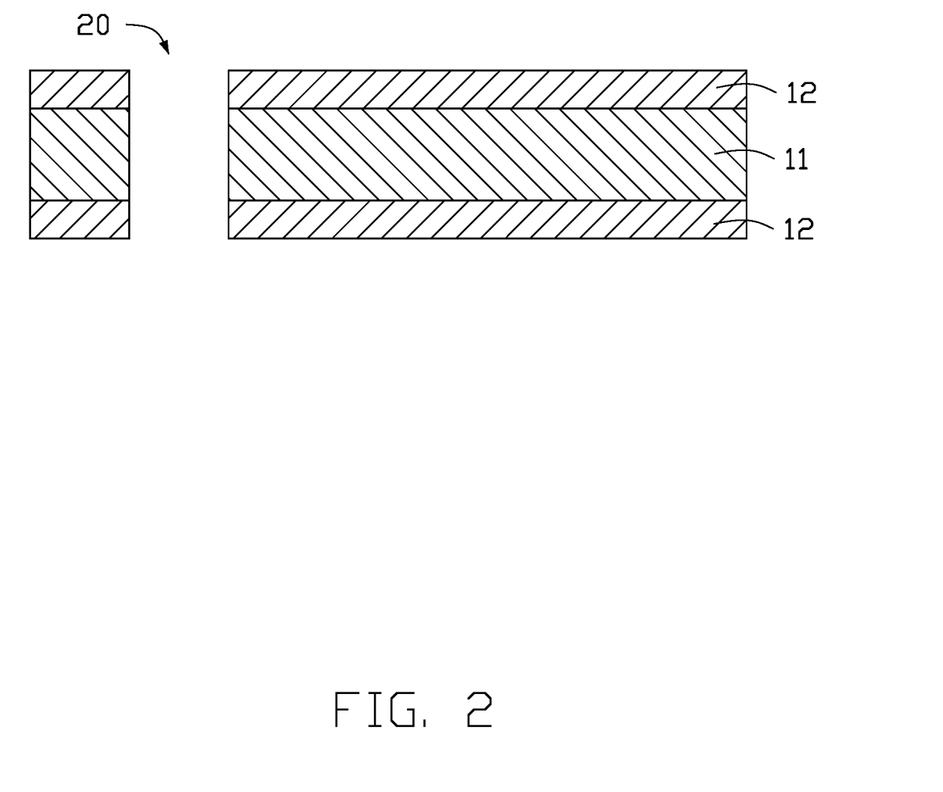
FIG. 2 is a cross-sectional view showing a through hole defined in the copper substrate of FIG. 1.

Step 2, referring to FIG. 2, at least one through hole 20 is defined in the copper substrate 10, which penetrates the base layer 11 and each of the copper foils 12.

The through hole 20 may be formed by laser or mechanical drilling.

Figure 3:
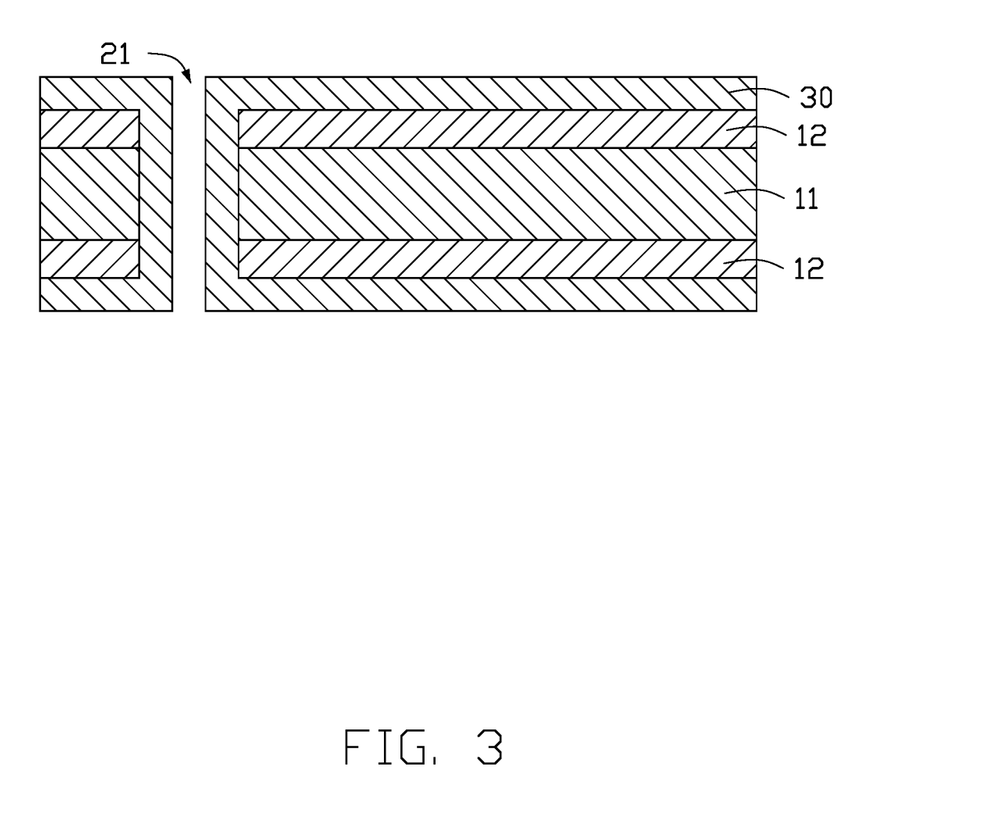
FIG. 3 is a cross-sectional view showing a copper-plated layer formed by electroplating on a copper foil of the copper substrate of FIG. 2.

Step 3, referring to FIG. 3, a copper-plated layer 30 is disposed on a surface of each of the copper foils 12 away from the base layer 11. The copper-plated layer 30 is also disposed on an inner wall of the through hole 20, thereby forming a conductive hole 21 electrically connecting the copper-plated layers 30 on opposite sides of the base layer 11 to each other.

In the embodiment, before the copper-plated layer 30 is formed, a surface metallization treatment is performed on the through hole 20. For example, a conductive layer (not shown) may be disposed on the inner wall of the through hole 20 by chemical plating, and then the copper-plated layer 30 is disposed on the conductive layer.

Figure 4:
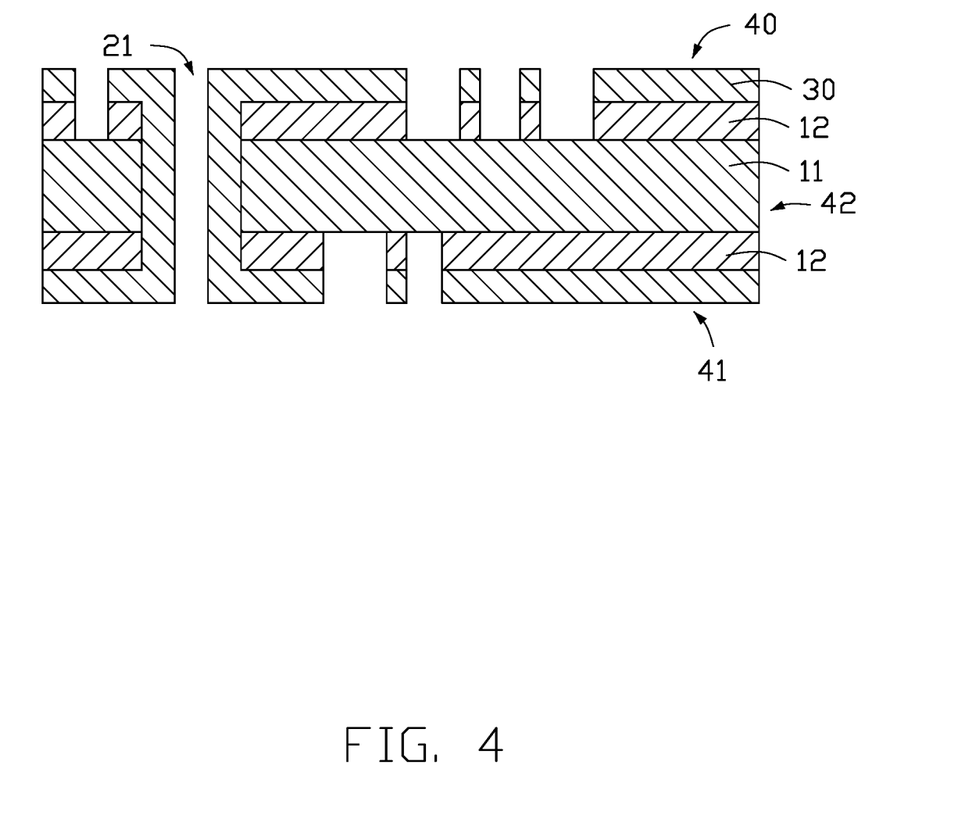
FIG. 4 is a cross-sectional view showing the copper-plated layer and the copper foil of FIG. 3 etched to form a first conductive circuit layer and a second conductive circuit layer.

Step 4, referring to FIG. 4, desired circuit patterns are formed in each of the copper-plated layers 30 and the copper foil 12 below by exposure and development technology, thereby obtaining a first conductive circuit layer 40 and a second conductive circuit layer 41. Thereby, a circuit substrate 42 is obtained.

In the embodiment, a first photosensitive layer (not shown) is first disposed on the copper-plated layer 30, and desired patterns are formed in the first photosensitive layer by exposure and development. Then, the copper-plated layer 30 is etched using the patterned first photosensitive layer as a photomask, thereby forming the first conductive circuit layer 40 and the second conductive circuit layer 41. The first photosensitive layer is then removed. The first photosensitive layer may be a dry film.

The conductive hole 21 electrically connects the first conductive circuit layer 40 and the second conductive circuit layer 41 to each other.

Figure 5:
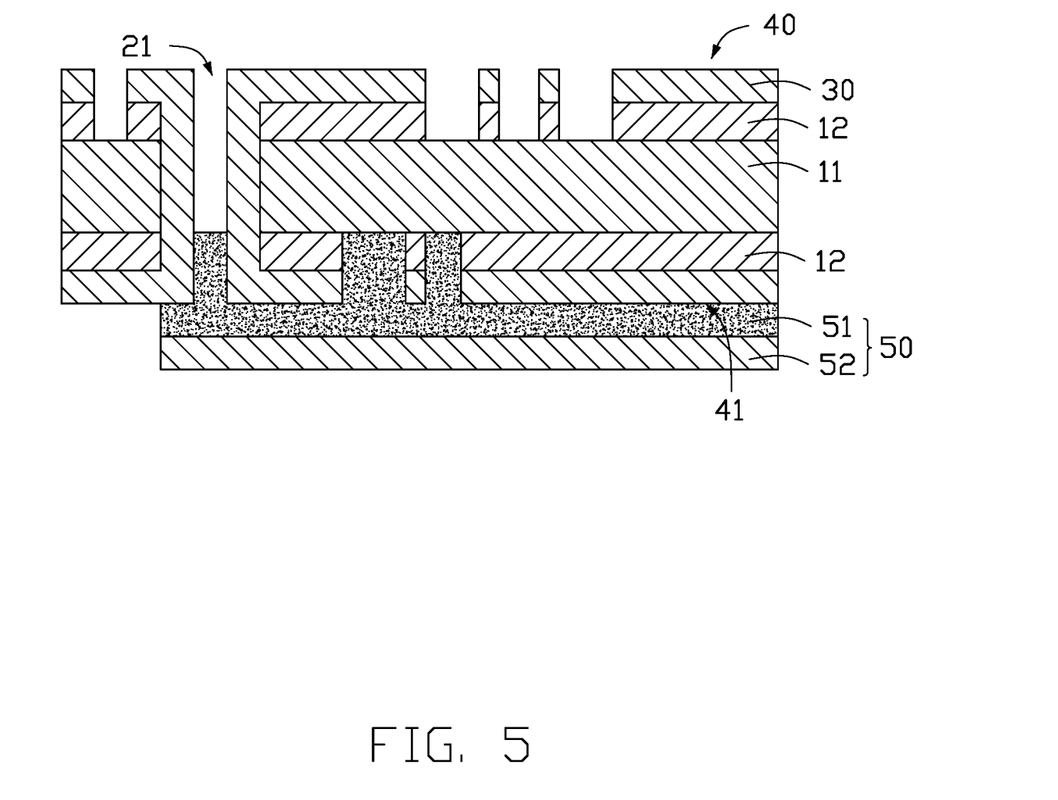
FIG. 5 is a cross-sectional view showing a first cover film disposed on the second conductive circuit layer of FIG. 4.

Step 5, referring to FIG. 5, a first cover film 50 is disposed on a surface of the second conductive circuit layer 41 of the circuit substrate 42 away from the base layer 11.

In the embodiment, the first cover film 50 includes a first adhesive layer 51 and a first insulating layer 52. The first adhesive layer 51 is disposed on the surface of the second conductive circuit layer 41 away from the base layer 11. The first adhesive layer 51 is in semi-solid state, so that the first adhesive layer 51 may flow and infill the gap of the second conductive circuit layer 41. The first adhesive layer 51 may further partially infill the conductive hole 21. The first adhesive layer 51 may be made of a common pure adhesive.

The first insulating layer 52 is disposed on a surface of the first adhesive layer 51 away from the second conductive circuit layer 41. The first insulating layer 52 may be made of at least one resin of polyimide, polyethylene terephthalate, and polyethylene naphthalate.

Figure 6:
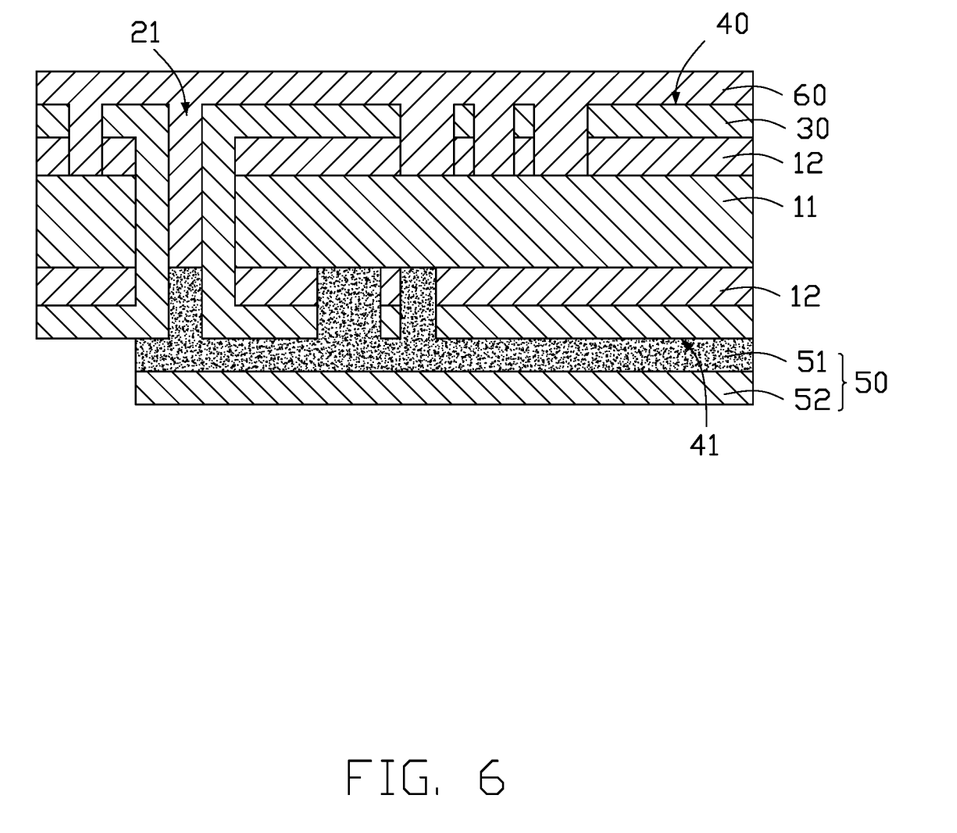
FIG. 6 is a cross-sectional view showing a solder mask layer disposed on the first conductive circuit layer of FIG. 5.

Step 6, referring to FIG. 6, a solder mask layer 60 is disposed on a surface of the first conductive circuit layer 40 away from the base layer 11. The solder mask layer 60 may include a white solder resist ink.

The solder mask layer 60 may further infill a gap of the first conductive circuit layer 40 and the conductive hole 21.

Figure 7:
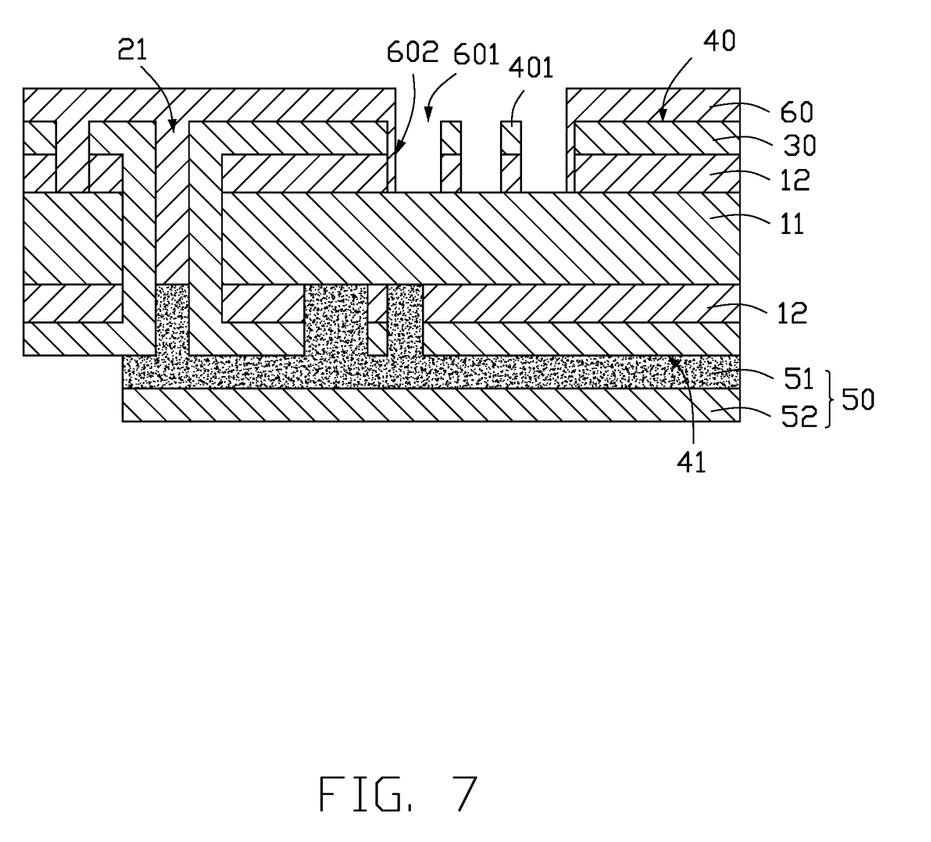
FIG. 7 is a cross-sectional view showing a slot defined in the solder mask layer of FIG. 6 to expose a solder pad.

Step 7, referring to FIG. 7, the solder mask layer 60 is etched to form a slot 601, which exposes a portion of the first conductive circuit layer 40. The exposed portion of the first conductive circuit layer 40 forms a solder pad 401.

In the embodiment, a second photosensitive layer (not shown) is first disposed on the surface of the solder mask layer 60, and desired patterns are formed in the second photosensitive layer by exposure and development. Then, the solder mask layer 60 is etched to form the slot 601 using the patterned second photosensitive layer as a photomask. The second photosensitive layer is then removed. The second photosensitive layer may be a dry film.

The solder mask layer 60 includes a sidewall 602 at the slot 601.

Figure 8:
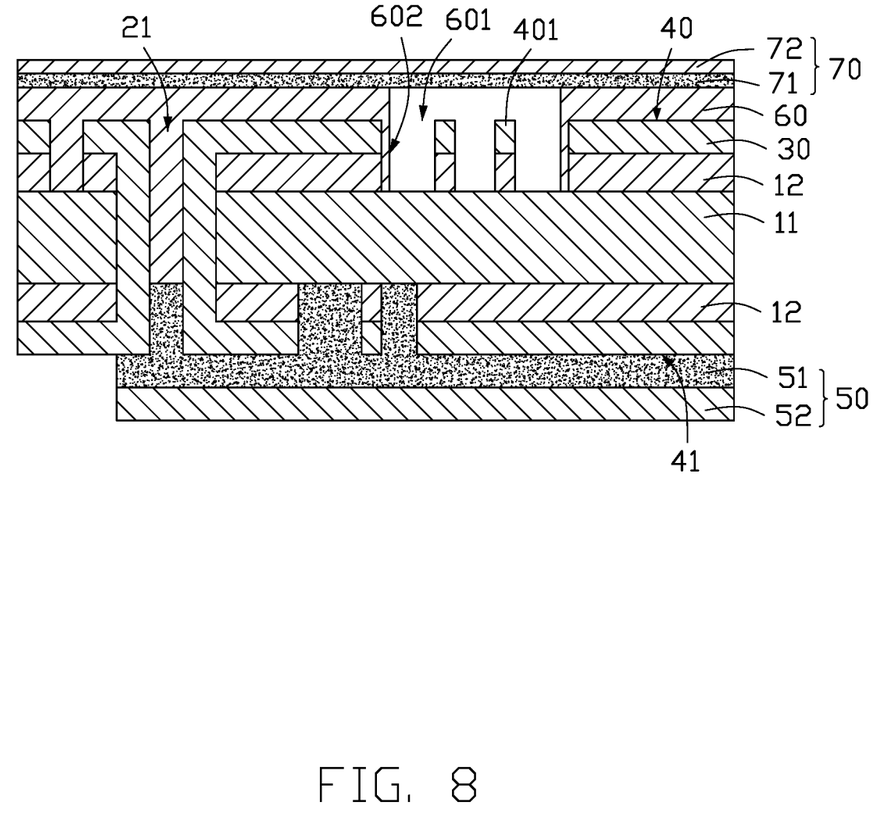
FIG. 8 is a cross-sectional view showing a second cover film disposed on the solder mask layer of FIG. 7.

Step 8, referring to FIG. 8, a second cover film 70 is disposed on a surface of the solder mask layer 60 having the slot 601, away from the first conductive circuit layer 40. The second cover film 70 includes a white resin. The white resin may include an insulating resin and a light diffusing material such as titanium dioxide (hereinafter, "a first light diffusing material"). The first light diffusing material is added to the insulating resin to increase light reflectivity.

The second cover film 70 may protect the solder mask layer 60, to prevent the surface of the solder mask layer 60 from being cracked when being bent, and increase a flexibility of the product.

When the solder mask layer 60 includes the white solder resist ink and the second cover film 70 includes the white resin, the solder mask layer 60 and the second cover film 70 cooperate with each other to improve the light reflectivity (which can reach 87%) of the product, and avoid a thickness of the solder mask layer 60 having to be increased. An increase in thickness of the solder mask layer 60 may result in uneven whiteness, caused by difficulty in precisely controlling the uniformity of the thickness.

In the embodiment, the second cover film 70 includes a second adhesive layer 71 and a second insulating layer 72. The second adhesive layer 71 is disposed on the surface of the solder mask layer 60 away from the first conductive circuit layer 40. The second adhesive layer 71 can include a common pure adhesive.

The second insulating layer 72 is disposed on the surface of the second adhesive layer 71 away from the solder mask layer 60. The second insulating layer 72 may include at least one resin of polyimide, polyethylene terephthalate, and polyethylene naphthalate. More specifically, the second insulating layer 72 may include the above white resin.

Furthermore, a second light diffusing material may be added to the base layer 11 to further improve the light reflectivity of the product. The second light diffusing material may be the same as or different from the first light diffusing material.

Figure 9:
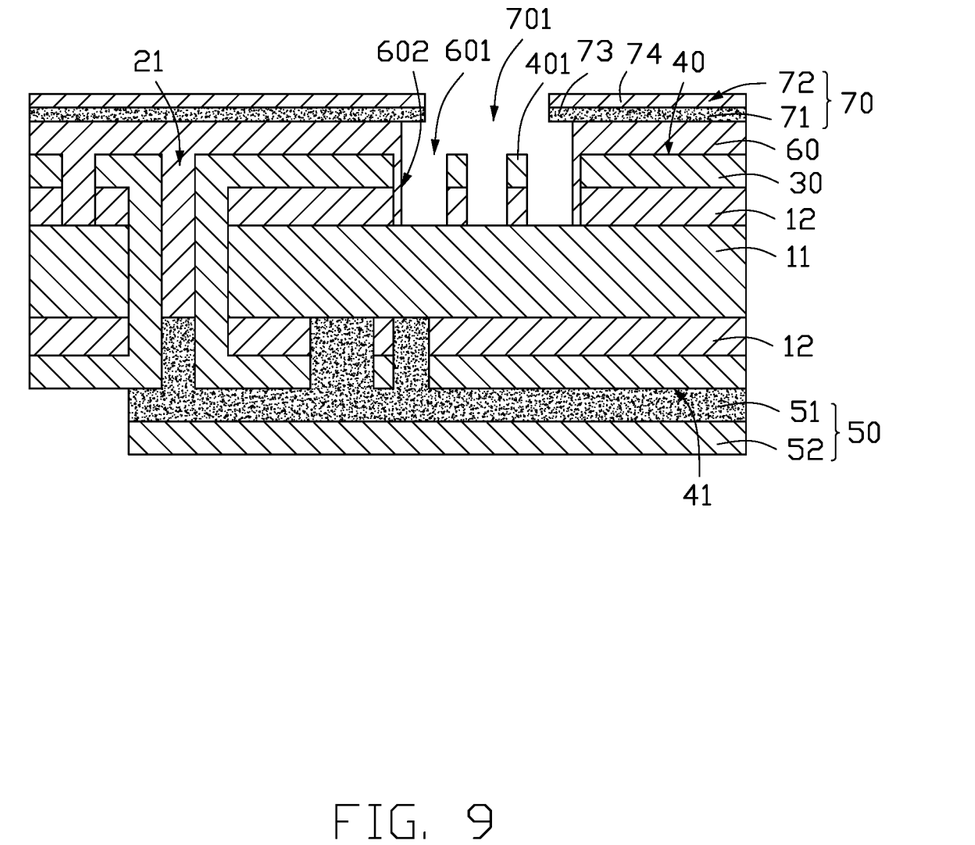
FIG. 9 is a cross-sectional view showing an opening defined in the second cover film of FIG. 8.

Step 9, referring to FIG. 9, an opening 701 is defined in the second cover film 70. The opening 701 corresponds to the slot 601, and exposes the solder pad 401.

The second cover film 70 includes a covering portion 74 and an extending portion 73. The covering portion 74 is disposed on the solder mask layer 60 having the slot 601. The extending portion 73 is connected to the covering portion 74, protrudes from the sidewall 602 of the solder mask layer 60, and surrounds the opening 701. A size of the opening 701 can be set according to a length of the extending portion 73 protruding from the sidewall 602. The length of the extending portion 73 protruding from the sidewall 602 is determined by a height of the sidewall 602 (see Step 10 below).

In the embodiment, the opening 701 may be formed by laser or mechanical drilling. Laser drilling is sufficient for precision and accuracy requirements of the opening 701.

Figure 10:
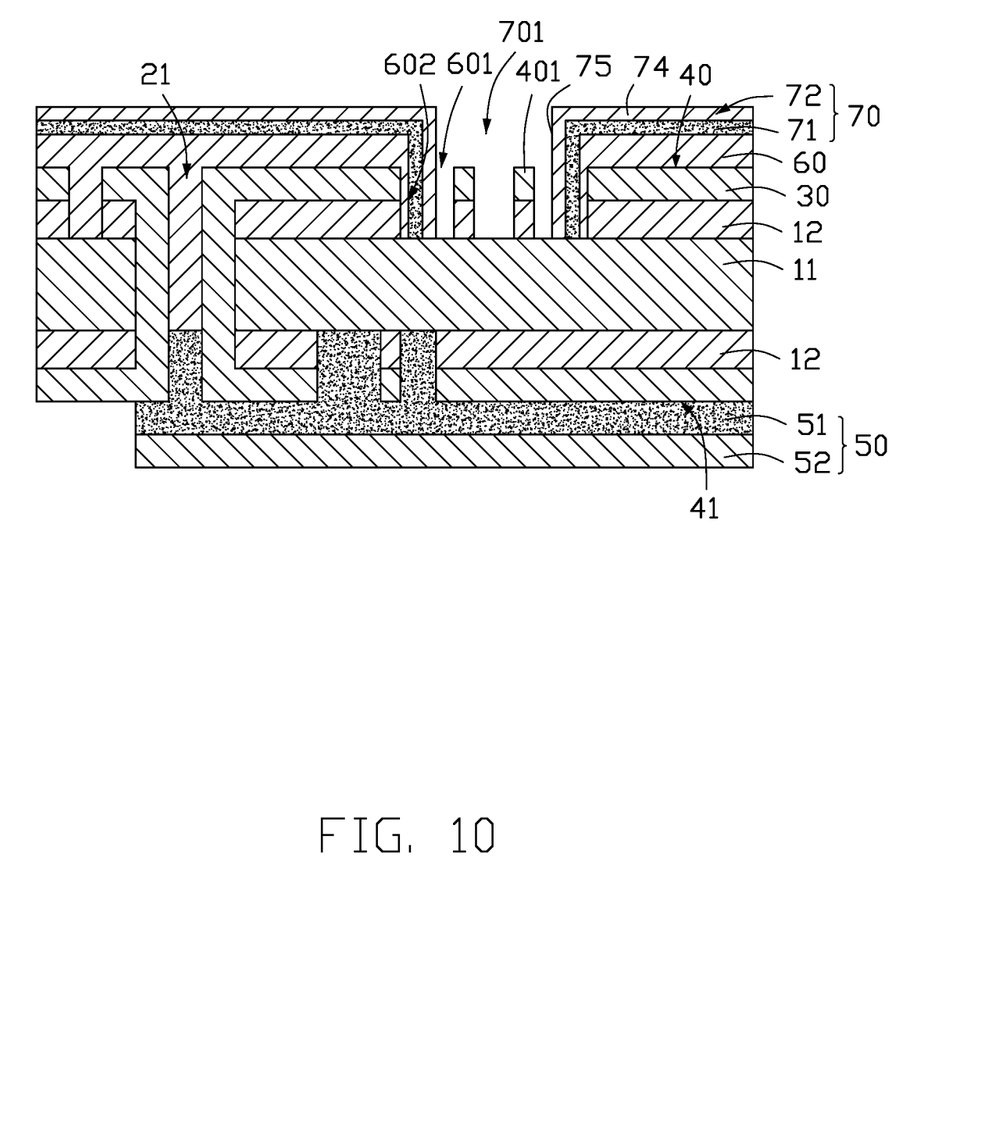
FIG. 10 is a cross-sectional view showing an extending portion of the second cover film of FIG. 9 pressed and attached to a sidewall of the solder mask layer.
Figure 11:
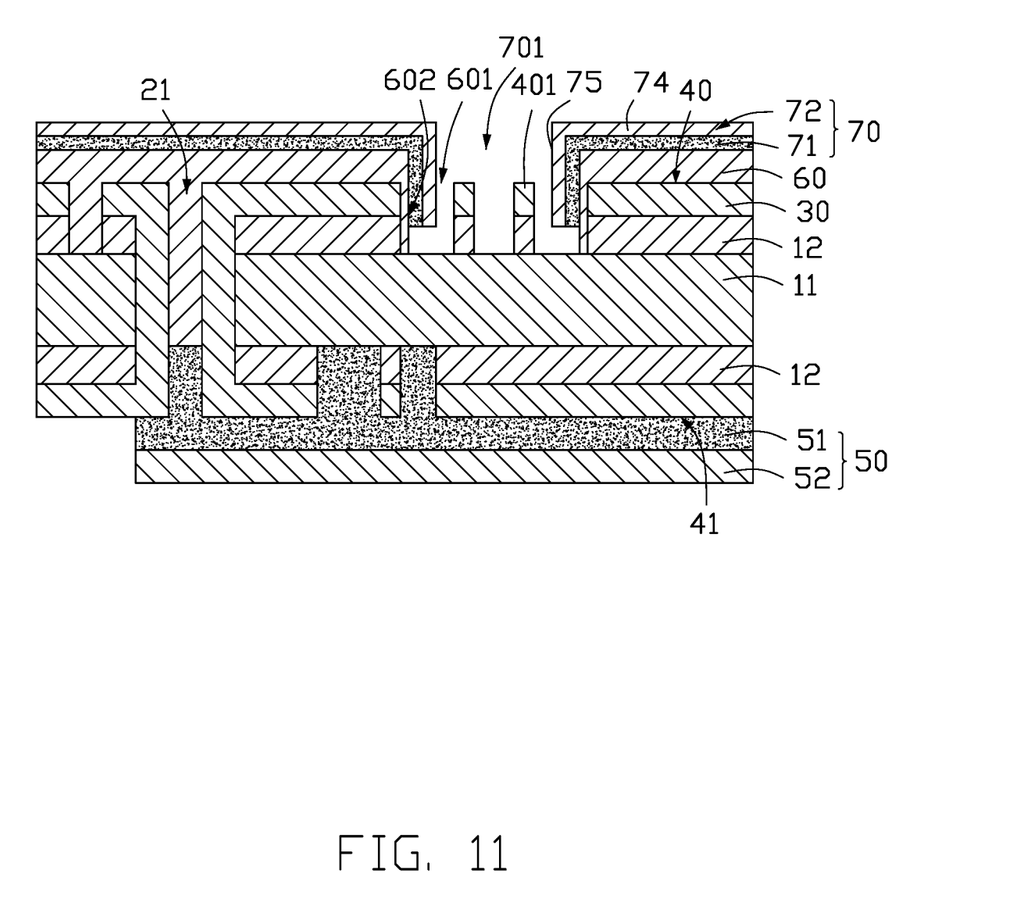
FIG. 11 is a cross-sectional view showing an extending portion of the second cover film of FIG. 9 pressed and attached to the sidewall of the solder mask layer in another embodiment.
Figure 12:
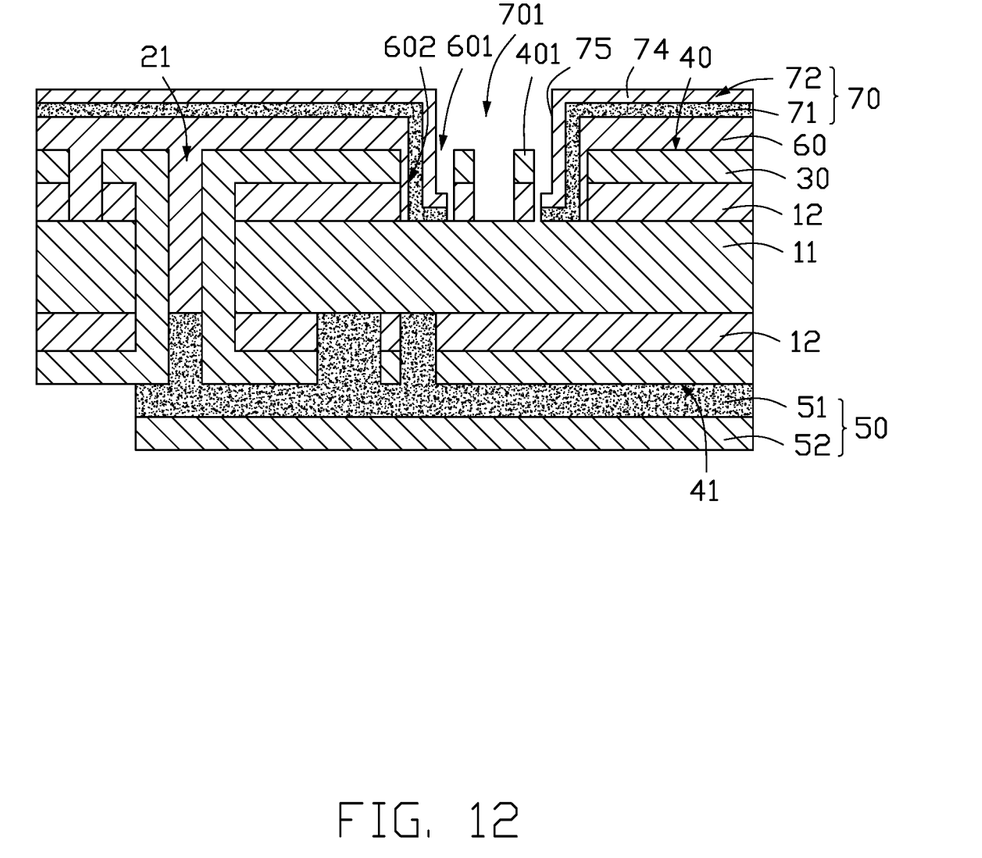
FIG. 12 is a cross-sectional view showing an extending portion of the second cover film of FIG. 9 pressed and attached to the sidewall of the solder mask layer in a further embodiment.

Step 10, referring to FIG. 10 to FIG. 12, the extending portion 73 of the second cover film 70 is pressed and attached to the sidewall 602 of the solder mask layer 60 to form a side reflecting portion 75.

The side reflecting portion 75 covers the sidewall 602, and when the light emitting element 101 (such as an LED, see FIG. 14) is connected to the solder pad 401, the light reflectivity at the side of the product is improved to a higher level by the side reflecting portion 75.

In the embodiment, as shown in FIG. 10, the length of the extending portion 73 protruding from the sidewall 602 is equal to the height of the sidewall 602, so that the sidewall 602 is entirely covered by the side reflecting portion 75.

In another embodiment, as shown in FIG. 11, the length of the extending portion 73 protruding from the sidewall 602 is less than the height of the sidewall 602, so that a bottom of the sidewall 602 away from the second cover film 70 is exposed from the side reflecting portion 75.

In other embodiments, as shown in FIG. 12, the length of the extending portion 73 protruding from the sidewall 602 is greater than the height of the sidewall 602, so that the sidewall 602 and a portion of the base layer 11 near the sidewall 602 are covered by the side reflecting portion 75.

Figure 13:
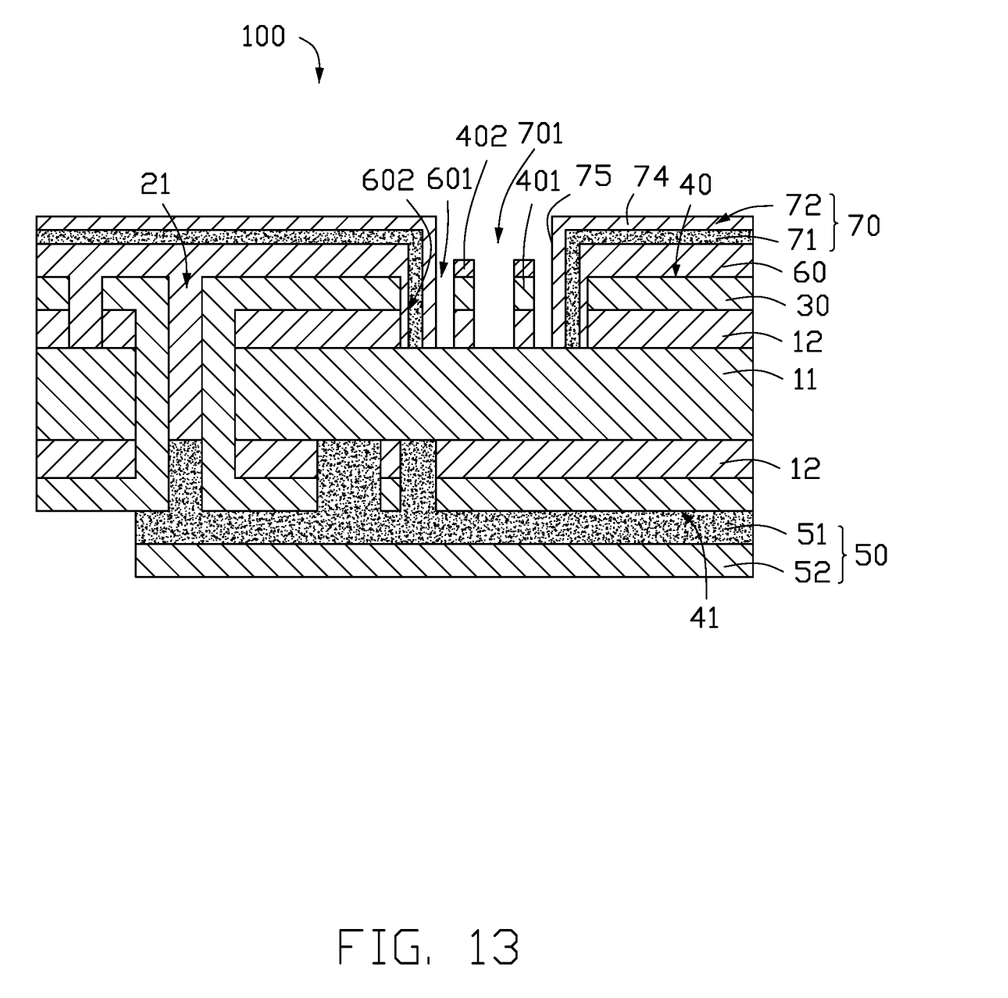
FIG. 13 is a cross-sectional view of a circuit board obtained by a surface treatment performed on the solder pad of FIG. 10.

Step 11, referring to FIG. 13, a surface treatment applied to the solder pad 401 allows the circuit board 100 to be obtained.

In the embodiment, the surface treatment may form a protective layer 402 of gold or nickel by chemical plating, and may also form an organic solder mask layer insulating layer (OSP, not shown) on the solder pad 401, which prevents oxidation of the surface of the solder pad reduction in electrical characteristics. The number of the solder pad(s) 401 can be set according to the number of the light emitting element(s) and the number of their pin(s).

In another embodiment, the copper substrate 10 may also be a single-sided copper substrate, including only one copper foil 12. At this time, the second conductive circuit layer 41 and the first cover film 50 on another copper foil 12 are omitted. In other embodiments, a number of the first conductive circuit layers 40 may be included, that is, a number of inner circuit layers at a side of the base layer 11 may be included.

Referring to FIG. 13, the present disclosure includes an embodiment of a circuit board 100. The circuit board 100 includes an insulating base layer 11, and a first conductive circuit layer 40 and a second conductive circuit layer 41 on opposite surfaces of the base layer 11.

A first cover film 50 is disposed on a surface of the second conductive circuit layer 41 away from the base layer 11. A solder mask layer 60 and a second cover film 70 are disposed in that order on a surface of the first conductive circuit layer 40 away from the base layer 11. The second cover film 70 includes a light diffusing material. To improve the light reflectivity at the side of the product, the solder mask layer 60 may further include a white solder resist ink.

The solder mask layer 60 defines a slot 601 exposing a portion of the first conductive circuit layer 40. The exposed portion of the first conductive circuit layer 40 forms a solder pad 401. The solder mask layer 60 includes a sidewall 602 at the slot 601.

The second cover film 70 defines an opening 701 corresponding to the slot 601 and for exposing the solder pad 401. The second cover film 70 includes a covering portion 74 and a side reflecting portion 75. The covering portion 74 is disposed on the solder mask layer 60 having the slot 601. The side reflecting portion 75 is connected to the covering portion 74 and covers the sidewall 602 of the solder mask layer 60.

Figure 14:
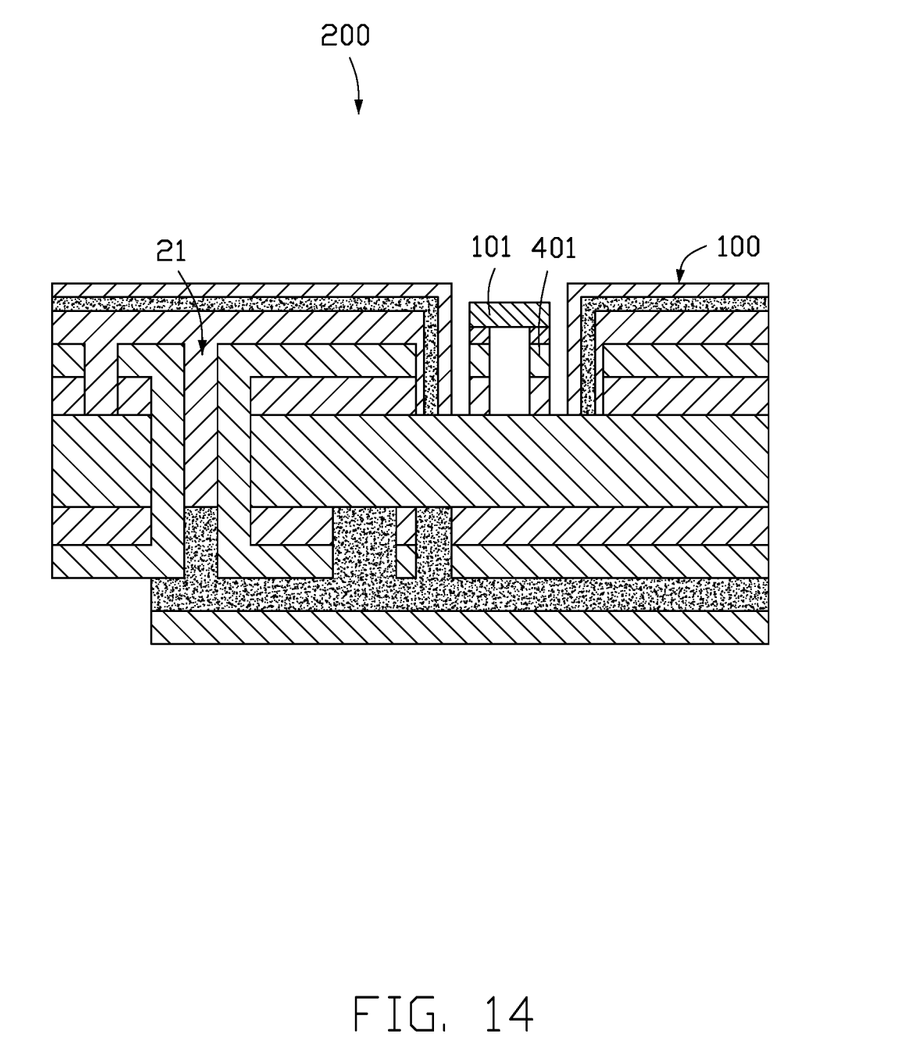
FIG. 14 is a cross-sectional view of a backlight obtained by connecting a light emitting element to the solder pad of FIG. 13.

Referring to FIG. 14, a backlight 200 in one embodiment is also disclosed. The backlight 200 includes the circuit board 100 and at least one light emitting element 101. The light emitting element 101 is disposed on and electrically connected to the solder pad 401. In the embodiment, the light emitting element 101 is a Mini LED.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A method of manufacturing a circuit board, comprising:
    providing a circuit substrate, the circuit substrate comprising an insulating base layer and a first conductive circuit layer disposed on a surface of the base layer;
    disposing a solder mask layer on a surface of the first conductive circuit layer away from the base layer;
    defining a slot in the solder mask layer, the slot configured to expose a portion of the first conductive circuit layer, the exposed portion of the first conductive circuit layer forming a solder pad, the solder mask layer comprising a sidewall at the slot;
    disposing a cover film on a surface of the solder mask layer having the slot away from the first conductive circuit layer, the cover film comprising a first light diffusing material;
    defining an opening in the cover film, the opening corresponding to the slot and being configured to expose the solder pad, the cover film comprising a covering portion and an extending portion, the covering portion being disposed on the solder mask layer having the slot, the extending portion being connected to the covering portion, protruding from the sidewall, and surrounding the opening; and
    pressing the extending portion to the sidewall to form a side reflecting portion.

2. The method for manufacturing the circuit board of claim 1, wherein the cover film comprises an adhesive layer and an insulating layer, the adhesive layer is disposed on the surface of the solder mask layer away from the first conductive circuit layer, the insulating layer is disposed on a surface of the adhesive layer away from the solder mask layer, the insulating layer is made of resin, and the first light diffusing material is added to the resin of the insulating layer.

3. The method for manufacturing the circuit board of claim 1, wherein the solder mask layer comprises a white solder resist ink.

4. The method for manufacturing the circuit board of claim 1, wherein the base layer is made of resin, and a second light diffusing material is added to the resin of the base layer.

5. The method for manufacturing the circuit board of claim 1, wherein a length of the extending portion protruding from the sidewall is equal to a height of the sidewall, so that the sidewall is entirely covered by the side reflecting portion.

6. The method for manufacturing the circuit board of claim 1, wherein a length of the extending portion protruding from the sidewall is smaller than a height of the sidewall, so that a bottom of the sidewall away from the cover film is exposed from the side reflecting portion.

7. The method for manufacturing the circuit board of claim 1, wherein a length of the extending portion protruding from the sidewall is greater than a height of the sidewall, so that the sidewall and a portion of the base layer near the sidewall are covered by the side reflecting portion.

8. The method for manufacturing the circuit board of claim 1, further comprising:
performing a surface treatment on the solder pad.

9. The method for manufacturing the circuit board of claim 1, wherein providing the circuit substrate comprises:
providing a copper substrate, the copper substrate comprising the base layer and a copper foil disposed on the surface of the base layer;
forming a copper-plated layer on a surface of the copper foil away from the base layer; and
etching the copper-plated layer and the copper foil to obtain the first conductive circuit layer, thereby obtaining the circuit substrate.

10. A circuit board, comprising:
an insulating base layer;
a first conductive circuit layer disposed on a surface of the base layer;
a solder mask layer covering a surface of the first conductive circuit layer away from the base layer, wherein the solder mask layer defines a slot, the slot is configured to expose a portion of the first conductive circuit layer, the exposed portion of the first conductive circuit layer forms a solder pad, the solder mask layer comprises a sidewall at the slot; and
a cover film covering a surface of the solder mask layer away from the first conductive circuit layer, wherein the cover film comprises a first light diffusing material, the cover film defines an opening, the opening corresponds to the slot and is configured to expose the solder pad, the cover film comprises a covering portion and a side reflecting portion, the covering portion is disposed on the solder mask layer having the slot, the side reflecting portion is connected to the covering portion and covers the sidewall.

11. The circuit board of claim 10, wherein the cover film comprises an adhesive layer and an insulating layer, the adhesive layer is disposed on the surface of the solder mask layer away from the first conductive circuit layer, the insulating layer is disposed on a surface of the adhesive layer away from the solder mask layer, the insulating layer is made of resin, and the first light diffusing material is added to the resin of the insulating layer.

12. The circuit board of claim 10, wherein the solder mask layer comprises a white solder resist ink.

13. The circuit board of claim 10, wherein the base layer is made of resin, and a second light diffusing material is added to the resin of the base layer.

14. A backlight, comprising:
a light emitting element; and
a circuit board, comprising:
an insulating base layer;
a first conductive circuit layer disposed on a surface of the base layer;
a solder mask layer covering a surface of the first conductive circuit layer away from the base layer, wherein the solder mask layer defines a slot, the slot is configured to expose a portion of the first conductive circuit layer, the exposed portion of the first conductive circuit layer forms a solder pad, the solder mask layer comprises a sidewall at the slot; and
a cover film covering a surface of the solder mask layer away from the first conductive circuit layer, wherein the cover film comprises a first light diffusing material, the cover film defines an opening, the opening corresponds to the slot and is configured to expose the solder pad, the cover film comprises a covering portion and a side reflecting portion, the covering portion is disposed on the solder mask layer having the slot, the side reflecting portion is connected to the covering portion and covers the sidewall, and the light emitting element is electrically connected to the solder pad.

15. The backlight of claim 14, wherein the cover film comprises an adhesive layer and an insulating layer, the adhesive layer is disposed on the surface of the solder mask layer away from the first conductive circuit layer, the insulating layer is disposed on a surface of the adhesive layer away from the solder mask layer, the insulating layer is made of resin, and the first light diffusing material is added to the resin of the insulating layer.

16. The backlight of claim 14, wherein the solder mask layer comprises a white solder resist ink.

17. The backlight of claim 14, wherein the base layer is made of resin, and a second light diffusing material is added to the resin of the base layer.

* * * * *